United States Patent
Hwang et al.

(10) Patent No.: US 12,471,385 B2
(45) Date of Patent: Nov. 11, 2025

(54) ELECTROSTATIC DISCHARGE PROTECTION DEVICES WITH MULTIPLE-DEPTH TRENCH ISOLATION

(71) Applicant: GlobalFoundries Singapore Pte. Ltd., Singapore (SG)

(72) Inventors: Kyongjin Hwang, Singapore (SG); Robert Gauthier, Jr., Williston, VT (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 537 days.

(21) Appl. No.: 18/077,299

(22) Filed: Dec. 8, 2022

(65) Prior Publication Data

US 2024/0194667 A1 Jun. 13, 2024

(51) Int. Cl.
*H10D 89/60* (2025.01)
(52) U.S. Cl.
CPC .................. *H10D 89/711* (2025.01)
(58) Field of Classification Search
CPC .................................................. H10D 89/711
See application file for complete search history.

(56) References Cited

U.S. PATENT DOCUMENTS

| | | | |
|---|---|---|---|
| 10,249,611 B1 | 4/2019 | Xi et al. | |
| 2014/0353799 A1* | 12/2014 | Hwang | H10D 10/00 257/565 |
| 2017/0069616 A1 | 3/2017 | Cai et al. | |
| 2018/0145065 A1 | 5/2018 | Holland et al. | |
| 2020/0098741 A1 | 3/2020 | Zeng | |
| 2020/0328204 A1 | 10/2020 | Salman et al. | |
| 2023/0098207 A1* | 3/2023 | Ikeura | H10D 10/40 257/488 |

OTHER PUBLICATIONS

Hwang, Kyongjin et al., "Electrostatic Discharge Control Devices" filed Oct. 27, 2022 as a U.S. Appl. No. 17/974,823.
Jung, Jin-Woo & Koo, Yong-Seo. (2014). "A design of BJT-based ESD protection device combining SCR for high voltage power clamps." JSTS: Journal of Semiconductor Technology and Science. 14. 339-344. 10.5573/JSTS.2014.14.3.339.

* cited by examiner

*Primary Examiner* — Davienne N Monbleau
*Assistant Examiner* — John Patrick Cornely
(74) *Attorney, Agent, or Firm* — Thompson Hine LLP; Francois Pagette

(57) ABSTRACT

Structures for an electrostatic discharge protection device and methods of forming same. The structure comprises a semiconductor substrate including first and second trench isolation regions positioned in the semiconductor substrate. The first trench isolation region extends to a first depth in the semiconductor substrate, and the second trench isolation region extends to a second depth in the semiconductor substrate. The second depth is greater than the first depth. A bipolar junction transistor structure includes a collector, an emitter, and a base each disposed in the semiconductor substrate. The collector includes a portion that extends to the top surface of the semiconductor substrate, the first trench isolation region is positioned in the base, the second trench isolation region is positioned in a lateral direction between the portion of the collector and the base, and the second trench isolation region surrounds the base, the emitter, and the first trench isolation region.

20 Claims, 5 Drawing Sheets

ELECTROSTATIC DISCHARGE PROTECTION DEVICES WITH MULTIPLE-DEPTH TRENCH ISOLATION

BACKGROUND

The disclosure relates generally to semiconductor devices and integrated circuit fabrication and, more specifically, to structures for an electrostatic discharge protection device and methods of forming same.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed toward the integrated circuit. An ESD event may occur during post-manufacture chip handling or after chip installation on a circuit board or other carrier. An ESD event may originate from a variety of sources, such as the human body, a machine component, or a chip carrier.

Precautions may be taken to protect the integrated circuit from an ESD event. One such precaution is an on-chip protection circuit that is designed to avert damage to the sensitive devices of the integrated circuit during an ESD event. If an ESD event occurs, the protection circuit triggers a protection device to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

Improved structures for an electrostatic discharge protection device and methods of forming same are needed.

SUMMARY

In an embodiment, a structure for an electrostatic discharge protection device is provided. The structure comprises first and second trench isolation regions positioned in a semiconductor substrate. The first trench isolation region extends to a first depth in the semiconductor substrate, and the second trench isolation region extends to a second depth in the semiconductor substrate. The second depth is greater than the first depth. The structure further comprises a bipolar junction transistor structure including a collector, an emitter, and a base each disposed in the semiconductor substrate. The collector and the emitter have a first conductivity type, the base has a second conductivity type opposite to the first conductivity type, the collector includes a portion that extends to the top surface of the semiconductor substrate, the first trench isolation region is positioned in the base, the second trench isolation region is positioned in a lateral direction between the portion of the collector and the base, and the second trench isolation region surrounds the base, the emitter, and the first trench isolation region.

In an embodiment, a method of forming a structure for an electrostatic discharge protection device is provided. The method comprises forming a first trench isolation region in a semiconductor substrate, and forming a second trench isolation region positioned in the semiconductor substrate. The first trench isolation region extends to a first depth in the semiconductor substrate, the second trench isolation region extends to a second depth in the semiconductor substrate, and the second depth is greater than the first depth. The method further comprises forming a collector, an emitter, and a base of a bipolar junction transistor structure in the semiconductor substrate. The collector and the emitter have a first conductivity type, the base has a second conductivity type opposite to the first conductivity type, the collector includes a portion that extends to the top surface of the semiconductor substrate, the first trench isolation region is positioned in the base, the second trench isolation region is positioned in a lateral direction between the portion of the collector and the base, and the second trench isolation region surrounds the base, the emitter, and the first trench isolation region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
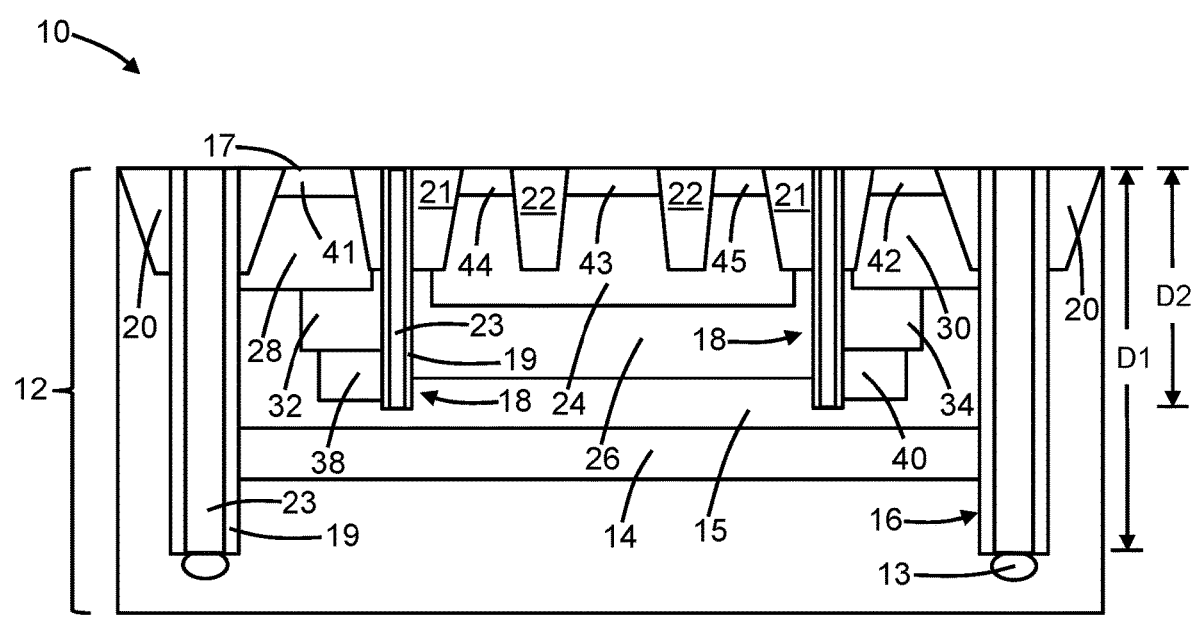
FIG. 1 is a cross-sectional view of a structure in accordance with embodiments of the invention.

With reference to FIG. 1 and in accordance with embodiments of the invention, a device structure 10 for an electrostatic discharge protection device includes a semiconductor substrate 12, a deep well 14, a deep trench isolation region 16, an intermediate trench isolation region 18, and shallow trench isolation regions 20, 21, 22. The semiconductor substrate 12 includes a semiconductor layer 15 that is surrounded on multiple sides by the deep well 14 and the deep trench isolation region 16. The semiconductor substrate 12 may be comprised of a semiconductor material, such as single-crystal silicon. In an embodiment, the semiconductor layer 15, which may be epitaxially grown, may be comprised of a semiconductor material, such as single-crystal silicon, that is doped to have n-type conductivity.

The deep well 14 is doped to have the same conductivity type as the semiconductor layer 15 but at a higher dopant concentration. In an embodiment, the deep well 14 may contain a concentration of an n-type dopant (e.g., arsenic or phosphorus) such that the deep well 14 has n-type conductivity. In an embodiment, the deep well 14 may be formed by introducing a dopant by, for example, a masked ion implantation into the semiconductor substrate 12. The implantation conditions (e.g., ion species, dose, kinetic energy) may be selected to tune the electrical and physical characteristics of the deep well 14.

The shallow trench isolation region 20 is arranged at the boundary between the semiconductor substrate 12 and the semiconductor layer 15, and the shallow trench isolation regions 21, 22 are arranged in the semiconductor layer 15. The shallow trench isolation regions 20, 21, 22 may be formed by patterning shallow trenches with lithography and etching processes, depositing a dielectric material, such as silicon dioxide, in the shallow trenches, and planarizing and/or recessing the deposited dielectric material.

The deep trench isolation region 16, the intermediate trench isolation region 18, and the shallow trench isolation regions 20, 21, 22 extend to different depths into the semiconductor substrate 12. In an embodiment, the deep trench isolation region 16 may extend to a depth D1 in the semiconductor substrate 12, the intermediate trench isolation region 18 may extend to a depth D2 in the semiconductor substrate 12, and the shallow trench isolation regions 20, 21, 22 may extend to a depth that is less than the depth D2. In an embodiment, the depths D1, D2 may be measured relative to the top surface 17 of the semiconductor substrate 12. The depth D2 of the intermediate trench isolation region 18 is greater than the depth of the shallow trench isolation regions 20, 21, 22, and the depth D1 of the deep trench isolation region 16 is greater than the depth D2 of the intermediate trench isolation region 18. The deep trench isolation region 16 may penetrate through the deep well 14, and the intermediate trench isolation region 18 may be spaced above the deep well 14 such that a portion of the semiconductor layer 15 is disposed in the space between the deep well 14 and the intermediate trench isolation region 18.

The deep trench isolation region 16 may be arranged to penetrate through the shallow trench isolation region 20. The intermediate trench isolation region 18 may be arranged to penetrate through the shallow trench isolation region 21. The shallow trench isolation region 22 is positioned interior of the intermediate trench isolation region 18. The shallow trench isolation regions 21, 22 and the intermediate trench isolation region 18 are surrounded by the deep trench isolation region 16. A portion of the semiconductor layer 15 is positioned in a lateral direction between the intermediate trench isolation region 18 and the deep trench isolation region 16.

The deep trench isolation region 16 and intermediate trench isolation region 18 may be formed by patterning trenches in the semiconductor substrate 12, lining the trenches with a dielectric collar 19, and filling the trenches with a conductor layer 23. The dielectric collar 19 may be comprised of, for example, silicon dioxide, and the conductor layer 23 may be comprised of a conductor, such as doped polysilicon. The trench used to form the intermediate trench isolation region 18 may have a narrower width than the trench used to form the deep trench isolation region 16, which results in the shallower depth for the intermediate trench isolation region 18 during patterning in comparison with the deep trench isolation region 16. A doped region 13 may be formed by ion implantation at the base of the trench used to form the deep trench isolation region 16 before forming the dielectric collar 19 and the conductor layer 23. In an embodiment, the doped region 13 may contain a concentration of a p-type dopant (e.g., boron) such that the doped region 13 has p-type conductivity.

The deep well 14 and deep trench isolation region 16 cooperate to electrically isolate the semiconductor layer 15 from the oppositely-doped semiconductor material of the semiconductor substrate 12 surrounding the deep well 14 and deep trench isolation region 16. The electrical isolation provided by the deep well 14 and deep trench isolation region 16 may boost current flow during operation of the electrostatic discharge protection device.

Wells 24, 26 may be positioned in the semiconductor layer 15 interior of the intermediate trench isolation region 18. The well 26 is positioned in a vertical direction between the well 24 and the deep well 14. The shallow trench isolation region 22 is fully positioned in the well 24, and a portion of the shallow trench isolation region 21 is positioned in the well 24. Wells 28, 30 may be laterally positioned in the semiconductor layer 15 between the deep trench isolation region 16 and intermediate trench isolation region 18. Wells 32, 34 may be respectively positioned in a vertical direction between the wells 28, 30 and the deep well 14.

In an embodiment, the wells 24, 26 may contain a concentration of a p-type dopant (e.g., boron) to provide p-type conductivity. The well 24 may have a higher dopant concentration than the well 26. The well 24 may represent a base of a bipolar junction transistor structure, and the well 26 may represent a drift region of the bipolar junction transistor structure. The well 24 may be formed by selectively implanting ions, such as ions including the p-type dopant, with an implantation mask having an opening defining the intended location for the well 24 in the semiconductor layer 15. The well 26 may be formed by selectively implanting ions, such as ions including the p-type dopant, with an implantation mask having an opening defining the intended location for the well 26 in the semiconductor layer 15. The implantation conditions (e.g., ion species, dose, kinetic energy) may be selected to tune the electrical and physical characteristics of the wells 24, 26.

In an embodiment, the wells 28, 30, the wells 32, 34, and the semiconductor layer 15 may contain a concentration of an n-type dopant (e.g., arsenic or phosphorus) to provide n-type conductivity. The wells 28, 30 may have a higher dopant concentration than the wells 32, 34, and the wells 32, 34 may have a higher dopant concentration than the semiconductor layer 15. The semiconductor layer 15, the wells 28, 30, and the wells 32, 34 may collectively represent a collector of the bipolar junction transistor structure, and the collector may be considered to wrap about the intermediate trench isolation region 18 by being physically located on multiple sides of the intermediate trench isolation region 18. A portion of the collector between the deep trench isolation region 16 and the intermediate trench isolation region 18 extends to the top surface 17.

The wells 28, 30 may be formed by selectively implanting ions, such as ions including the n-type dopant, with an implantation mask having openings defining the intended locations for the wells 28, 30 in the semiconductor layer 15. The wells 32, 34 may be concurrently formed by selectively implanting ions, such as ions including the n-type dopant, with an implantation mask having openings defining the intended locations for the wells 32, 34 in the semiconductor layer 15. The implantation conditions (e.g., ion species, dose, kinetic energy) may be selected to tune the electrical and physical characteristics of the wells 28, 30 and the wells 32, 34.

Doped regions 38, 40 are disposed in the semiconductor layer 15. The doped region 38 is positioned in a vertical direction between the well 32 and the deep well 14, and the doped region 40 is positioned in a vertical direction between the well 34 and the deep well 14. The doped regions 38, 40 may be formed by introducing a dopant of a given conductivity type by, for example, ion implantation into the semiconductor layer 15. A patterned implantation mask may be formed to define selected areas on the top surface 17 that are exposed for the implantation of ions. The implantation mask may include a layer of an organic photoresist that is applied and patterned to form openings exposing the selected areas on the top surface 17 and determining the location and horizontal dimensions of the doped regions 38, 40. The implantation mask has a thickness and stopping power sufficient to block the implantation of ions in masked areas.

The implantation conditions (e.g., ion species, dose, kinetic energy) may be selected to tune the electrical and physical characteristics of the doped regions 38, 40. The doped regions 38, 40 are doped to have an opposite conductivity type from the collector defined by semiconductor layer 15, the wells 28, 30, and the wells 32, 34. In an embodiment, the doped regions 38, 40 may contain a concentration of a p-type dopant (e.g., boron) to provide p-type conductivity.

In an embodiment, the doped region 38 may abut the adjacent portion of the intermediate trench isolation region 18 at a sidewall of the trench in which the intermediate trench isolation region 18 is formed. In an embodiment, the doped region 40 may abut the adjacent portion of the intermediate trench isolation region 18 at a sidewall of the trench in which the intermediate trench isolation region 18 is formed. In an embodiment, the doped regions 38, 40 may be fully positioned between the depth D2 of the intermediate trench isolation region 18 and the top surface 17. In an embodiment, the doped regions 38, 40 may be positioned in a lateral direction between the deep trench isolation region 16 and the intermediate trench isolation region 18. In an embodiment, a portion of the semiconductor layer 15 may be positioned in a lateral direction between the doped region 38 and the deep trench isolation region 16, and another portion of the semiconductor layer 15 may be positioned in a lateral direction between the doped region 40 and the deep trench isolation region 16.

A doped region 41 is positioned in the well 28, a doped region 42 is positioned in the well 30, and a doped region 43 is positioned in the well 24. The doped regions 41, 42, 43 are located in a vertical direction adjacent to the top surface 17. The doped region 43 is surrounded by the shallow trench isolation region 22.

The doped regions 41, 42 may be doped to have the same conductivity type as the wells 28, 30 but at a higher dopant concentration, and the doped region 43 may be doped to have an opposite conductivity type from the well 24. In an embodiment, the doped regions 41, 42, 43 may contain a concentration of an n-type dopant (e.g., arsenic or phosphorus) to provide n-type conductivity. The doped regions 41, 42, 43 may be concurrently formed by selectively implanting ions, such as ions including the n-type dopant, with an implantation mask having openings defining the intended locations for the doped regions 41, 42, 43 in the semiconductor layer 15. The implantation conditions (e.g., ion species, dose, kinetic energy) may be selected to tune the electrical and physical characteristics of the doped regions 41, 42, 43.

Doped regions 44, 45 are positioned in the well 24. The doped regions 44, 45 are located in a vertical direction adjacent to the top surface 17. The doped regions 44, 45 may be doped to have the same conductivity type as the well 24 but at a higher dopant concentration. In an embodiment, the doped regions 44, 45 may contain a concentration of a p-type dopant (e.g., boron) to provide p-type conductivity. The doped regions 44, 45 may be concurrently formed by selectively implanting ions, such as ions including the p-type dopant, with an implantation mask having openings defining the intended locations for the doped regions 44, 45 in the semiconductor layer 15. The implantation conditions (e.g., ion species, dose, kinetic energy) may be selected to tune the electrical and physical characteristics of the doped regions 44, 45. The shallow trench isolation region 22 is positioned between the doped regions 44, 45 and the doped region 43.

The doped region 43 may represent an emitter of the bipolar junction transistor structure. The well 24 may represent a base of the bipolar junction transistor structure. The doped region 43, the wells 24, 26, and the deep well 14 may provide a vertical NPN, and the wells 28, 30, the doped regions 44, 45, and the deep well 14 may provide another vertical NPN. The intermediate trench isolation region 18 surrounds the doped region 43 representing the emitter and the well 24 representing the base on all sides in a lateral direction. The intermediate trench isolation region 18 also surrounds the well 26, the shallow trench isolation region 22, and a portion of the shallow trench isolation region 21. The deep trench isolation region 16 surrounds the emitter, base, and collector on all sides in a lateral direction, and also surrounds the intermediate trench isolation region 18.

Figure 2:
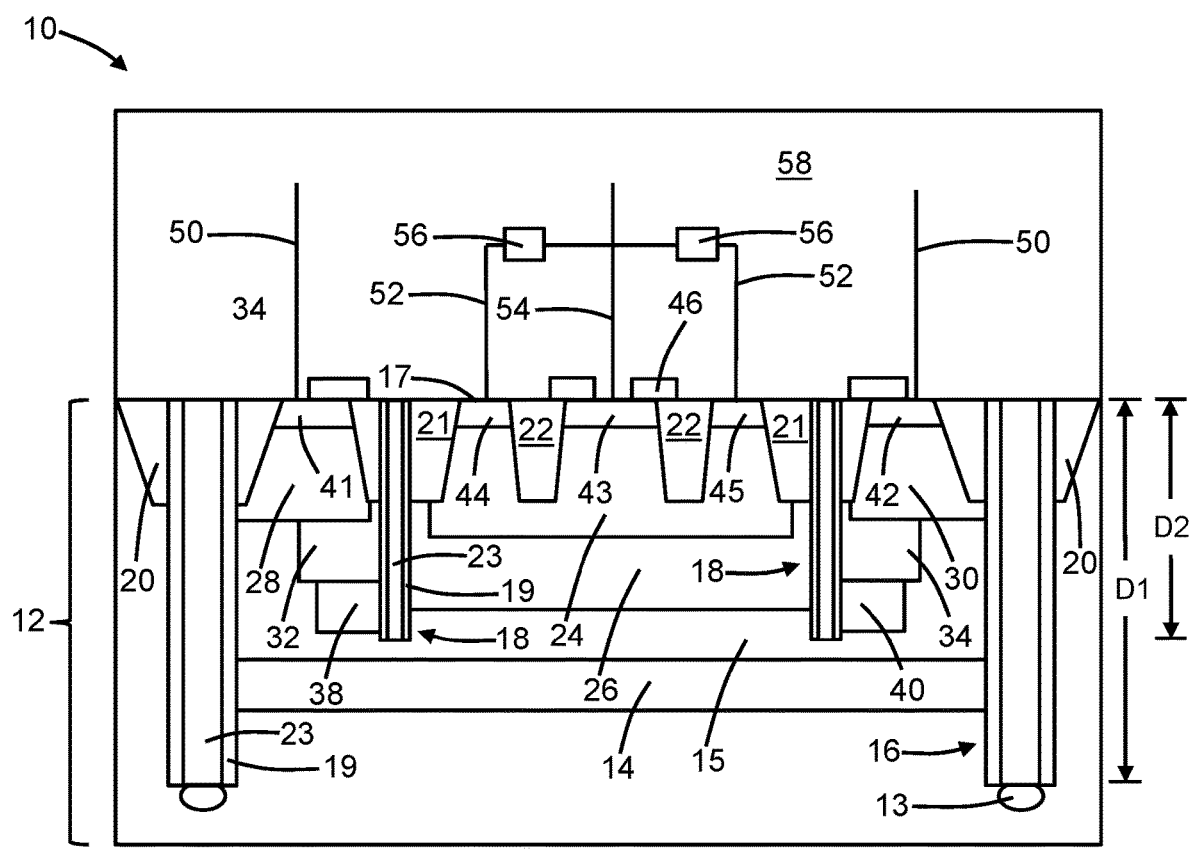
FIG. 2 is a cross-sectional view of the structure at a fabrication stage subsequent to FIG. 1.

With reference to FIG. 2 in which like reference numerals refer to like features in FIG. 1 and at a subsequent fabrication stage, a dielectric layer 46 may be formed that includes sections positioned on the top surface 17 of the semiconductor substrate 12. The dielectric layer 46 may be comprised of a dielectric material, such as silicon nitride, that is deposited and then patterned by lithography and etching processes to form the sections. One section of the dielectric layer 46 has an overlapping relationship with a portion of the doped region 41. Another section of the dielectric layer 46 has an overlapping relationship with a portion of the doped region 42. Other portions of the doped regions 41, 42, which are adjacent to the shallow trench isolation region 20, are not overlapped by the sections of the dielectric layer 46. Sections of the dielectric layer 46 have an overlapping relationship with portions of the doped region 43 adjacent to the shallow trench isolation region 22, and another portion of the doped region 43 is not overlapped by the sections of the dielectric layer 46. The sections of the dielectric layer 46 may function as a silicide-blocking layer.

The device structure 10 may include an interconnect structure 58 formed by middle-of-line processing and back-end-of-line processing. The interconnect structure 58 may include electrical connections 50, 52, 54 that are coupled to the electrostatic discharge protection device. The electrical connections 50, 52, 54 may include metal features that are disposed in one or more dielectric layers of the interconnect structure 58.

The electrical connections 50 are physically and electrically connected to portions of the doped regions 41, 42 that are not covered by the sections of the dielectric layer 46, and the electrical connections 50 supply connections through the doped regions 41, 42 to the semiconductor layer 15, the wells 28, 30, and the wells 32, 34 providing the collector. The electrical connections 52 are physically and electrically connected to the doped regions 44, 45 disposed in the well 24 providing the base. The electrical connection 54 is physically and electrically connected to the doped region 43 providing the emitter. The doped regions 44, 45 are connected to the doped region 43 by the electrical connections 52, which includes resistors 56 that are connected to the emitter. In an embodiment, the resistors 56 may have a resistance value of ten kiloohms. The presence of the resistors 56 may enhance the ability of the electrostatic discharge protection device to trigger in response to an electrostatic discharge event.

The device structure 10 for the electrostatic discharge protection device may be characterized as a bipolar transistor structure that includes an emitter represented by the doped region 43, a base represented by the well 24, and a collector collectively represented by semiconductor layer 15, the wells 28, 30, and the wells 32, 34. The components of the collector are all doped to have the same conductivity type (e.g., n-type conductivity) but with various different dopant concentrations among the different components. The collector is doped to have the same conductivity type as the emitter and an opposite conductivity type from the base.

The doped regions 38, 40, which have an opposite conductivity type from the collector, are included in the electrostatic discharge protection device and are embedded in the collector of the bipolar junction transistor structure. The doped regions 38, 40 are electrically floating because of an absence of a direct electrical connection in the interconnect structure 58 and the opposite conductivity type to the collector. The presence of the electrically-floating doped regions 38, 40 may enhance the current performance of the electrostatic discharge protection device.

The intermediate trench isolation region 18, which is disposed in a lateral direction between the base and the majority of the collector, may function to reduce the footprint of the device structure 10 and to increase the breakdown voltage of the device structure 10. The collector of the bipolar junction transistor structure wraps about the intermediate trench isolation region 18 in that the collector is located in a space between the wells 24, 26 and the deep well 14, in a space between the deep trench isolation region 16 and the intermediate trench isolation region 18, and in a space between the intermediate trench isolation region 18 and the deep well 14. The intermediate trench isolation region 18 may contribute to providing the device structure 10 with high current performance and a high holding voltage. The deep trench isolation region 16 extends in a vertical direction to a greater depth in the semiconductor substrate 12 than the collector and the intermediate trench isolation region 18.

The well 24 representing the base of the bipolar junction transistor structure is surrounded by the intermediate trench isolation region 18, and the doped region 43 representing the emitter of the bipolar junction transistor structure is surrounded by the shallow trench isolation region 22. Respective portions of the collector (i.e., the wells 28, 30, wells 32, 34, and doped regions 41, 42) are positioned in a vertical direction between the top surface 17 and each of the doped regions 38, 40. In an embodiment, these portions of the collector may fully separate the doped regions 38, 40 from the top surface 17.

Figure 3:
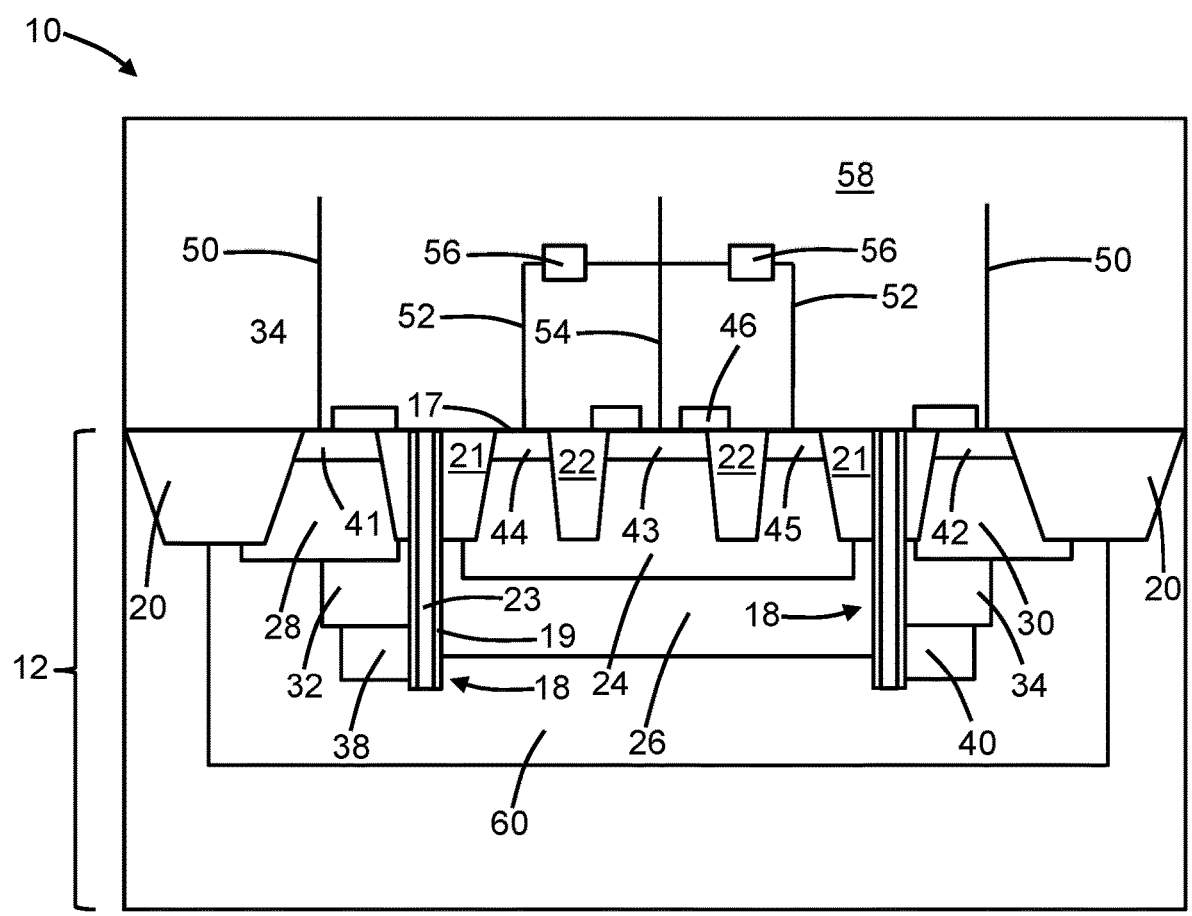
FIG. 3 is a cross-sectional view of a structure in accordance with alternative embodiments of the invention.

With reference to FIG. 3 in which like reference numerals refer to like features in FIG. 2 and in accordance with alternative embodiments of the invention, the deep well 14 and the deep trench isolation region 16 of the device structure 10 may be replaced by a well 60. The well 60 may be formed by a masked ion implantation and may be doped to have the same conductivity type as the deep well 14. In an embodiment, the well 60 may be doped with a concentration of an n-type dopant (e.g., arsenic or phosphorus) to provide n-type conductivity. The well 60 may provide junction isolation, in combination with the deep well 14, for the bipolar junction transistor structure.

Figure 4:
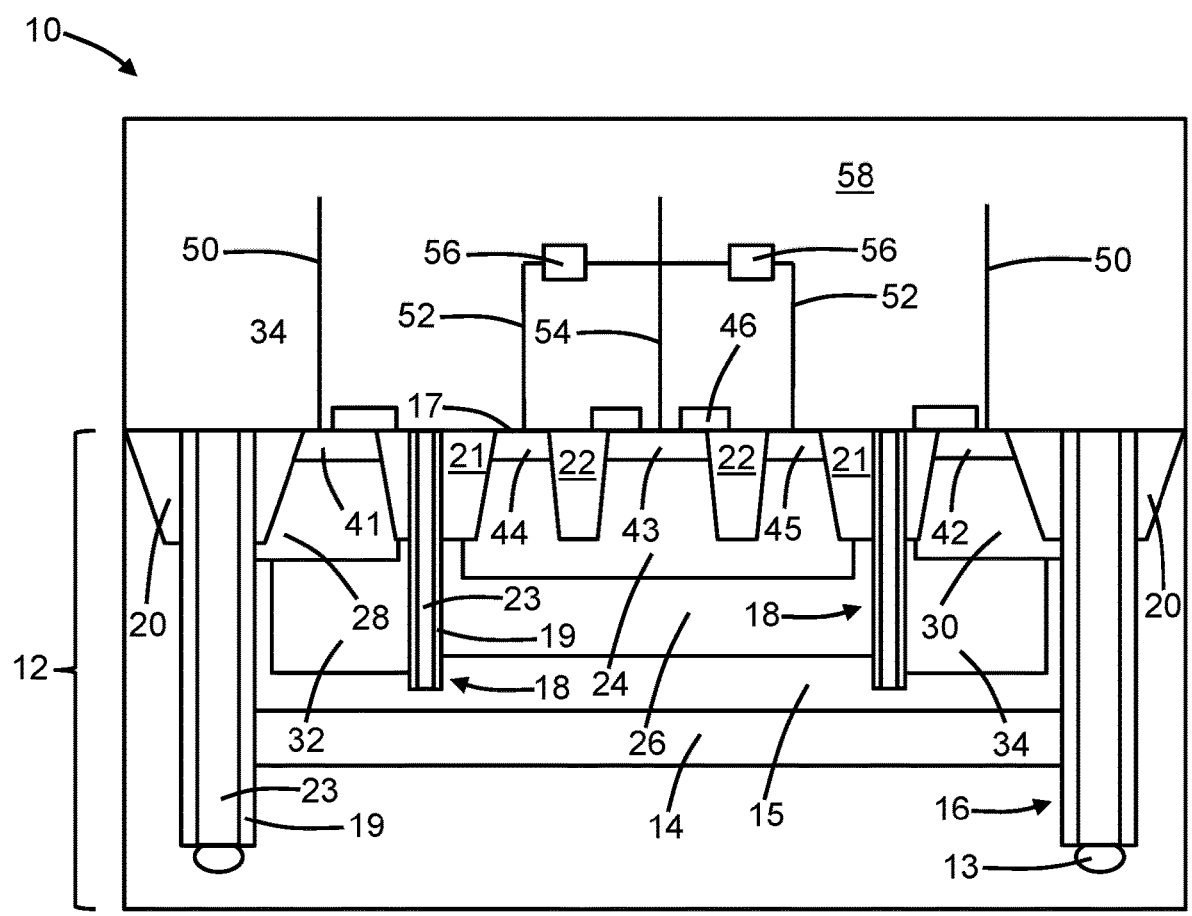
FIG. 4 is a cross-sectional view of a structure in accordance with alternative embodiments of the invention.

With reference to FIG. 4 in which like reference numerals refer to like features in FIG. 3 and in accordance with alternative embodiments of the invention, the device structure 10 may be modified to eliminate the doped regions 38, 40, and may also be modified to enlarge the wells 32, 34 in width and depth.

Figure 5:
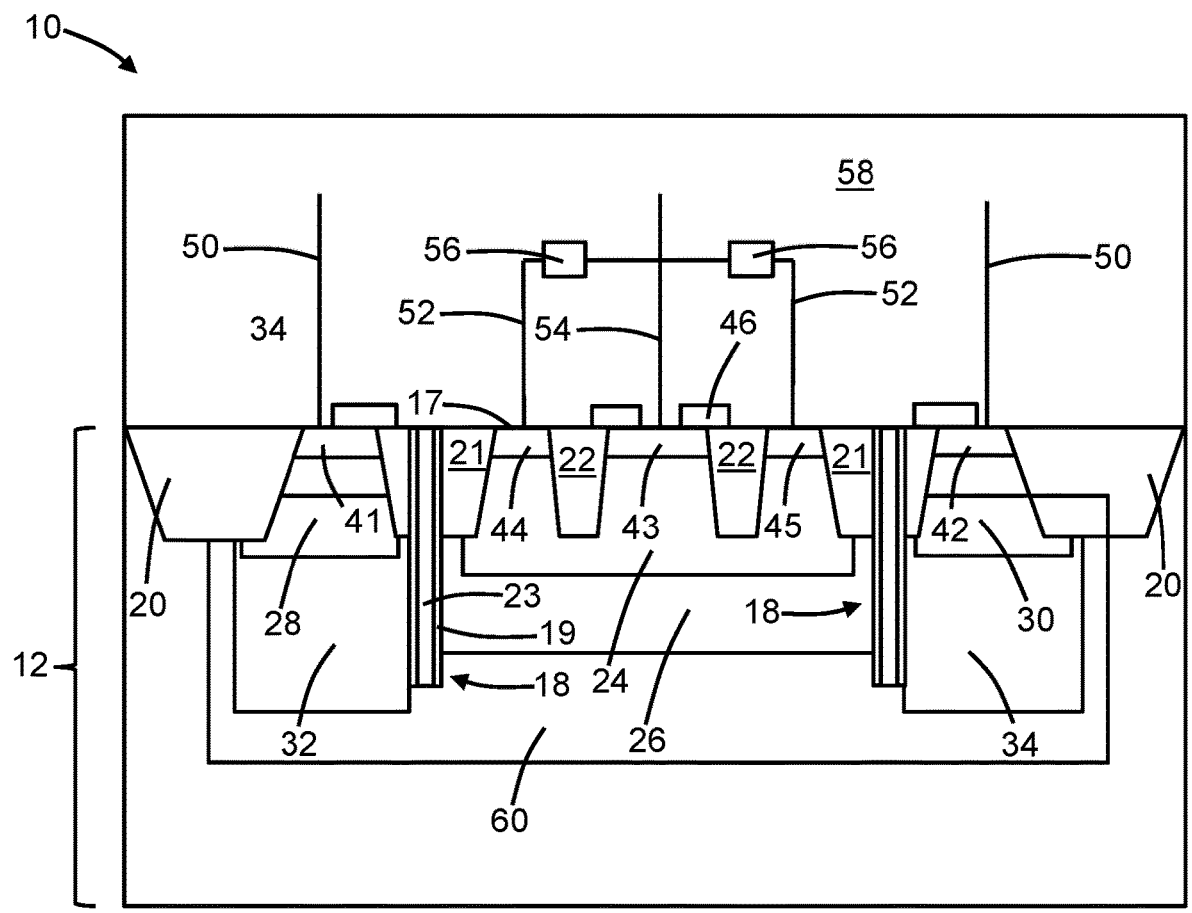
FIG. 5 is a cross-sectional view of a structure in accordance with alternative embodiments of the invention.

With reference to FIG. 5 in which like reference numerals refer to like features in FIG. 3 and in accordance with alternative embodiments of the invention, the device structure 10 may be modified to eliminate the deep well 14, the doped regions 38, 40, and the deep trench isolation region 16, and may also be modified to enlarge the wells 32, 34 in width and depth.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an electrostatic discharge protection device, the structure comprising:
   a semiconductor substrate having a top surface;
   a first trench isolation region positioned in the semiconductor substrate, the first trench isolation region extending to a first depth in the semiconductor substrate;
   a second trench isolation region positioned in the semiconductor substrate, the second trench isolation region extending to a second depth in the semiconductor substrate, and the second depth is greater than the first depth;

a bipolar junction transistor structure including a collector in the semiconductor substrate, an emitter in the semiconductor substrate, and a base in the semiconductor substrate, the collector and the emitter having a first conductivity type, the base having a second conductivity type opposite to the first conductivity type, and the collector including a portion that extends to the top surface of the semiconductor substrate; and a doped region positioned in the collector adjacent to the second trench isolation region, the doped region having the second conductivity type, wherein the first trench isolation region is positioned in the base, the second trench isolation region is positioned in a lateral direction between the portion of the collector and the base, and the second trench isolation region surrounds the base, the emitter, and the first trench isolation region.

2. The structure of claim 1 wherein the doped region abuts the second trench isolation region.

3. The structure of claim 1 wherein the doped region is fully positioned between the second depth and the top surface of the semiconductor substrate.

4. The structure of claim 3 wherein the portion of the collector is positioned between the doped region and the top surface of the semiconductor substrate.

5. The structure of claim 1 further comprising:
a third trench isolation region positioned in the semiconductor substrate, the third trench isolation region surrounding the collector, the emitter, the base, the first trench isolation region, and the second trench isolation region, the third trench isolation region extending to a third depth in the semiconductor substrate that is greater than the second depth,
wherein the doped region is positioned in the lateral direction between the second trench isolation region and the third trench isolation region.

6. The structure of claim 1 wherein the collector wraps about the second trench isolation region.

7. The structure of claim 1 wherein the second trench isolation region extends from the top surface of the semiconductor substrate to the second depth.

8. The structure of claim 1 wherein the first trench isolation region surrounds the emitter.

9. The structure of claim 1 further comprising:
a third trench isolation region positioned in the semiconductor substrate, the third trench isolation region surrounding the collector, the emitter, the base, the first trench isolation region, and the second trench isolation region, and the third trench isolation region extending to a third depth in the semiconductor substrate that is greater than the second depth.

10. The structure of claim 9 wherein the portion of the collector is positioned in the lateral direction between the second trench isolation region and the third trench isolation region.

11. The structure of claim 1 further comprising:
a dielectric layer including a section positioned at the top surface of the semiconductor substrate on a first portion of the emitter.

12. The structure of claim 11 further comprising:
an interconnect structure including an electrical connection coupled to a second portion of the emitter.

13. The structure of claim 1 further comprising:
a dielectric layer including a section positioned at the top surface of the semiconductor substrate on a first portion of the collector.

14. The structure of claim 13 further comprising:
an interconnect structure including an electrical connection coupled to a second portion of the collector.

15. The structure of claim 1 further comprising:
an electrical connection between the base and the emitter; and
a resistor in the electrical connection between the base and the emitter.

16. The structure of claim 1 further comprising:
a well in the semiconductor substrate, the well surrounding the collector, the emitter, and the base, and the well having an opposite conductivity type from the semiconductor substrate.

17. The structure of claim 1 further comprising:
a drift well in the semiconductor substrate, the drift well having the second conductivity type, and the drift well containing a lower dopant concentration than the base,
wherein the drift well is positioned in a vertical direction between the second depth and the base, and the drift well is surrounded by the second trench isolation region.

18. The structure of claim 17 further comprising:
a third trench isolation region positioned in the semiconductor substrate, the third trench isolation region surrounding the collector, the emitter, the base, the drift well, the first trench isolation region, and the second trench isolation region, and the third trench isolation region extending to a third depth in the semiconductor substrate that is greater than the second depth.

19. The structure of claim 1 wherein the semiconductor substrate includes a trench, and the first trench isolation region includes a dielectric collar lining the trench and a conductor layer inside the trench.

20. A method of forming a structure for an electrostatic discharge protection device, the method comprising:
forming a first trench isolation region in a semiconductor substrate, wherein the first trench isolation region extends to a first depth in the semiconductor substrate;
forming a second trench isolation region positioned in the semiconductor substrate, wherein the second trench isolation region extends to a second depth in the semiconductor substrate, and the second depth is greater than the first depth;
forming a collector, an emitter, and a base of a bipolar junction transistor structure in the semiconductor substrate, wherein the collector and the emitter have a first conductivity type, the base has a second conductivity type opposite to the first conductivity type, the collector includes a portion that extends to a top surface of the semiconductor substrate, the first trench isolation region is positioned in the base, the second trench isolation region is positioned in a lateral direction between the portion of the collector and the base, and the second trench isolation region surrounds the base, the emitter, and the first trench isolation region; and
forming a doped region positioned in the collector adjacent to the second trench isolation region, wherein the doped region has the second conductivity type.

* * * * *